US006749103B1

(12) United States Patent
Ivanov et al.

(10) Patent No.: US 6,749,103 B1
(45) Date of Patent: *Jun. 15, 2004

(54) LOW TEMPERATURE SPUTTER TARGET BONDING METHOD AND TARGET ASSEMBLIES PRODUCED THEREBY

(75) Inventors: Eugene Y. Ivanov, Grove City, OH (US); Harry W. Conard, Orient, OH (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/720,347

(22) PCT Filed: Aug. 27, 1999

(86) PCT No.: PCT/US99/19869

§ 371 (c)(1), (2), (4) Date: Dec. 21, 2000

(87) PCT Pub. No.: WO00/15863

PCT Pub. Date: Mar. 23, 2000

Related U.S. Application Data

(60) Provisional application No. 60/129,559, filed on Apr. 16, 1999, and provisional application No. 60/099,981, filed on Sep. 11, 1998.

(51) Int. Cl.[7] ................. B23K 31/02; B23K 20/12; C23C 14/00; C25B 11/00
(52) U.S. Cl. ............ 228/115; 228/112.1; 228/114; 228/116; 228/171; 228/173.2; 204/298.12; 204/298.13
(58) Field of Search .............. 228/164, 112.1, 228/115, 114, 125, 116, 136, 141.1, 165–170, 173.1, 174, 193–195, 114.5, 171, 173.2; 204/298.12, 298.13

(56) References Cited

U.S. PATENT DOCUMENTS

| | | | |
|---|---|---|---|
| 4,652,358 A | 3/1987 | Deppisch et al. | |
| 4,885,075 A | 12/1989 | Hillman | |
| 4,968,665 A | 11/1990 | Ohuchi et al. | |
| 5,009,765 A | * 4/1991 | Qamar et al. | 204/298.12 |
| 5,143,590 A | * 9/1992 | Strothers et al. | 204/298.12 |
| 5,215,639 A | * 6/1993 | Boys | 204/192.12 |
| 5,230,459 A | * 7/1993 | Mueller et al. | 228/164 |
| 5,269,899 A | * 12/1993 | Fan | 204/298.09 |
| 5,282,943 A | 2/1994 | Lannutti et al. | |
| 5,342,496 A | * 8/1994 | Stellrecht | 204/298.12 |
| 5,397,050 A | 3/1995 | Mueller | |
| 5,415,754 A | 5/1995 | Manley | |
| 5,593,082 A | 1/1997 | Ivanov et al. | |
| 5,653,856 A | 8/1997 | Ivanov et al. | |
| 5,676,803 A | 10/1997 | Demaray et al. | |

(List continued on next page.)

FOREIGN PATENT DOCUMENTS

| | | | |
|---|---|---|---|
| JP | 59-232270 A | * 12/1984 | |
| JP | 02043362 | 8/1988 | |

(List continued on next page.)

*Primary Examiner*—L. Edmondson
(74) *Attorney, Agent, or Firm*—Wegman Hessler & Vanderburg

(57) ABSTRACT

A low temperature target and backing plate bonding process and assemblies made thereby. A plurality of projections are formed in the harder member of the assembly. The assembly is bonded by conventional techniques around the peripheral assembly boundaries. The assembly is then pressure consolidated at low temperature so that the projections, circumscribed by the bonded zone, penetrate into the softer member promoting the formation of metal to metal cold diffusion type bonds.

45 Claims, 5 Drawing Sheets

U.S. PATENT DOCUMENTS

| | | |
|---|---|---|
| 5,693,203 A | 12/1997 | Ohhashi et al. |
| 5,803,342 A | 9/1998 | Kardokus |
| 5,836,506 A * | 11/1998 | Hunt et al. ................ 228/172 |
| 5,879,524 A | 3/1999 | Hurwitt et al. |
| 6,071,389 A * | 6/2000 | Zhang ................ 204/298.12 |
| 6,074,279 A * | 6/2000 | Yoshimura et al. .......... 451/37 |
| 6,113,761 A * | 9/2000 | Kardokus et al. ...... 204/298.13 |
| 6,164,519 A * | 12/2000 | Gilman et al. ............. 228/107 |
| 6,199,259 B1 * | 3/2001 | Demaray et al. ............ 29/458 |
| 6,451,185 B2 * | 9/2002 | Beier et al. ............ 204/298.12 |

FOREIGN PATENT DOCUMENTS

| | | | |
|---|---|---|---|
| JP | 043362 A | * | 2/1990 |
| JP | 02-043362 A | * | 2/1990 |
| JP | 04-128371 A | * | 4/1992 |
| JP | 04-168267 A | * | 6/1992 |
| JP | 06081142 | | 8/1992 |
| JP | 06-065733 A | * | 3/1994 |

* cited by examiner

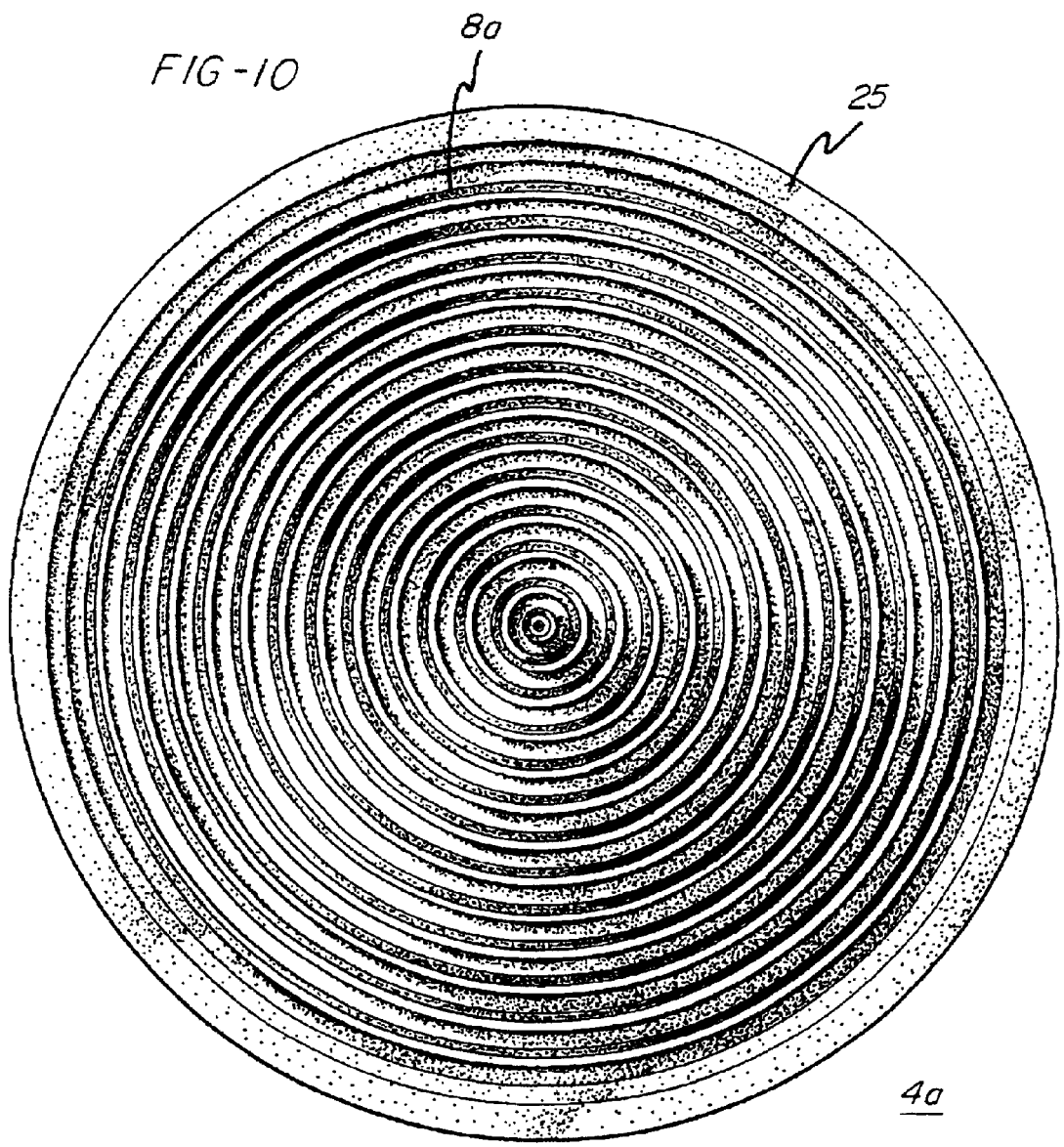

LOW TEMPERATURE SPUTTER TARGET BONDING METHOD AND TARGET ASSEMBLIES PRODUCED THEREBY

CROSS-REFERENCE TO RELATED APPLICATIONS

Priority filing benefit of (1) International PCT application PCT/US99/19869 filed Aug. 27, 1999, and published under PCT 21(2) in the English language and (2) U.S. provisional application Serial No. 60/099,981 filed Sep. 11, 1998 and U.S. Provisional Patent Application Serial No. 60/129,559 filed Apr. 16, 1999.

FIELD OF THE INVENTION

The present application pertains to a low temperature sputter target/backing plate bonding method and to the assemblies made thereby.

BACKGROUND OF THE INVENTION

Cathodic sputtering is widely used for the deposition of thin layers of material onto desired substrates. Basically, this process requires gas ion bombardment of a target having a face formed of a material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a heat conducting backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use of an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e. consumed for subsequent deposition on the substrate) in a generally annular section of the target face, known as the target raceway.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known disposition in order to form the above-noted magnetic field in the form of a loop or tunnel extending around the exposed face of the target.

In order to achieve good thermal and electrical contact between the target and backing plate, these members are commonly attached to each other by means of soldering, brazing, diffusion bonding, clamping and by epoxy cement and the like.

In some prior art target/backing plate assemblies, projections formed in either the interfacial surfaces of the target or backing plate are received in corresponding recesses or grooves of the other member to improve thermal conductivity. For example in Hillman U.S. Pat. No. 4,885,075, annularly arranged members of high thermal conductivity protrude from either the target or backing plate into a corresponding recess formed in the other member. Upon heating of the target during sputtering, the protruding members expand radially to make contact with the recess wall to thereby improve heat transfer between the target and backing plate.

Elastic and plastic deformation of backing plate members in target/backing plate cathode assemblies is minimized in accordance with U.S. Pat. No. 5,269,899 (Fan), of common assignment herewith, by the provision of mating teeth like projections disposed along the target/backing plate interfacial surfaces, with the mating surface of the backing plate having a concave surface. Here again, upon heating of the target, the target teeth expand radially and make snug contact with the mating teeth on the backing member to enhance thermal conductivity.

U.S. Pat. No. 5,230,459 (Mueller et al.) of common assignment herewith teaches the use of diffusion bonding methods wherein one of the target/backing plate mating surfaces is first prepared with grooves or the like. During the diffusion bonding process, jagged portions of the grooves penetrate into the metal from the opposed interfacial surface and disrupt the formation of oxide and other bond inhibiting layers that may otherwise form along the target/backing plate interface to thereby improve bonding efficacy. The method results in a strong bond with increased shear resistance such that the assembly can withstand thermal stress that otherwise may tend to result in debonding or target warpage during use.

In those cases in which diffusion bonding of Al, Cu, or other low melting point targets have been tried, the heat needed for the diffusion bonding process causes an undesirable growth in grain size. Accordingly, there is a need in the art to provide a low temperature target bonding method so that target grain size can be accurately controlled and maintained at a desired minimal size.

SUMMARY OF THE INVENTION

In order to meet the above need, a target and backing plate are provided wherein the harder metal of the two is machined or otherwise formed so as to have a plurality of ridges or other salient surface portions thereof. These ridges or salient portions are formed along the interior surface space of the target or backing plate. The ridged surface is then placed alongside the mating surface of the other member of the assembly along a target/backing plate interface wherein bonding will occur.

The peripheral portion of the interfacial surface of the assembly is bonded by conventional means such as E-beam welding, TIG welding, friction welding, etc., preferably under vacuum. The assembly is then pressed together at a low temperature, such as room temperature, so that the target and backing plate are in contact to improve thermal conductivity of the assembly.

The projections or ridges formed along either the target or backing plate penetrate into the mating metal surface along the target/backing plate interface. These projections penetrate the softer metal on the opposing mating surface breaking through the oxide surface thereon. This results in a metal to metal cold diffusion type bond with the projections bending as a result of the cold pressing and forming a mechanical interlocking mechanism.

After the cold pressing operation, a low temperature annealing can be performed on the assembly to enhance adherence of the mating surfaces.

The invention will be further described in conjunction with the attached drawings and following detailed description. In the drawings:

BRIEF DESCRIPTION OF THE DRAWINGS

FIG. 10 is a top plan view of the backing plate shown in the FIG. 1 embodiment.

DETAILED DESCRIPTION OF THE PREFERRED EMBODIMENT

Figure 1:
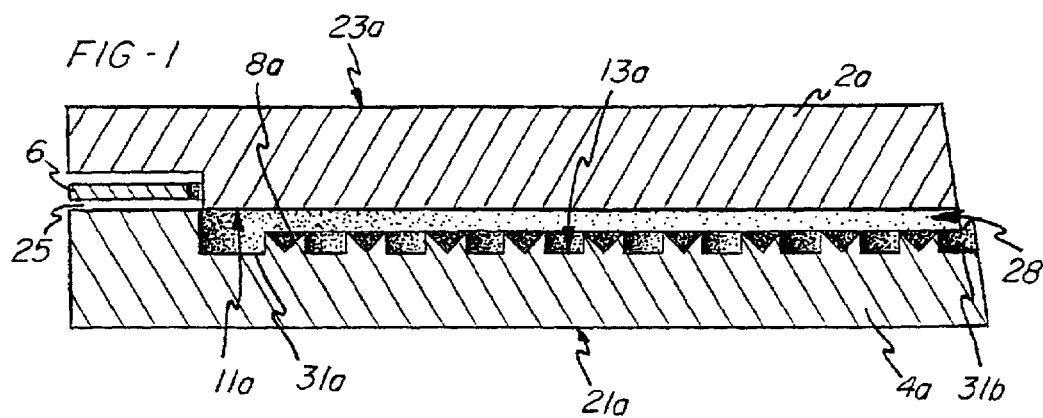
FIG. 1 is a cross-sectional view of the preferred target/backing plate assembly in accordance with the invention, prior to the low temperature pressure consolidation step.
Figure 4:
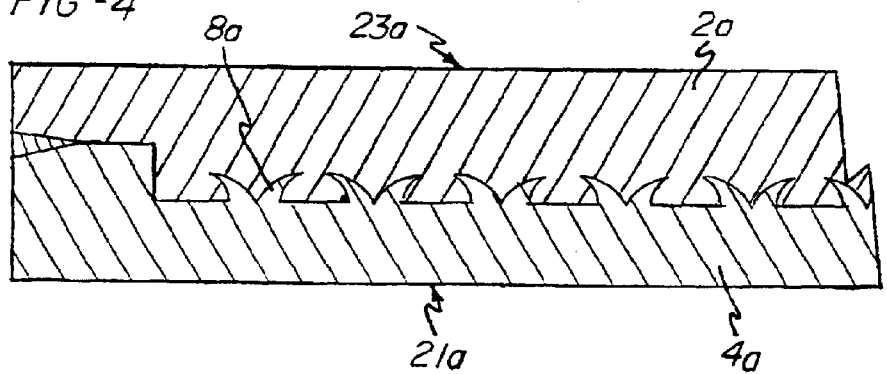
FIG. 4 is a cross-sectional view of the target/backing plate assembly shown in FIG. 1, taken after bonding of the assembly by the low temperature pressure consolidation step in accordance with the invention.

Turning first to FIGS. 1 and 4, there is shown a first embodiment of a target/backing plate assembly in accordance with the invention. The assembly comprises a target 2a having a top side 23a carrying metal or metal alloy that, in accordance with conventional sputtering methods, will be ejected from the target 2a via ionic bombardment and will travel to and coat the desired substrate.

A backing plate 4a is provided under the target 2a, with the bottom side 11a of the target 2a adapted to mate with the top side 13a of the backing plate 4a to define an interfacial surface area 28. A generally horizontal plane exists through the points 31a, 31b, along this interfacial surface area 28 and serves as the location where the interfacial surfaces will be joined upon bonding. Commonly, a heat exchange fluid such as water is circulated adjacent the bottom side 21a of the backing plate 4a so as to cool the assembly during its sputtering operation.

In some cases, it is desired to provide a filler material 6, such as an Al-4% Si alloy or other suitable alloy, in the form of a ring or the like, adjacent the peripheral border of the assembly between the target and backing plate. The filler material 6 enhances bonding of the target 2a to the backing plate 4a as shall be explained hereinafter. Alternatively, the filler material 6 may be omitted.

A plurality of salient portions 8a, shown in the drawing as "M"-shaped ridges or projections are machined into either one of the surfaces 11a or 13a depending on whether the target 2a or backing plate 4a is harder. Stated differently, the projections 8a are formed in the harder of the surfaces 11a or 13a. In this embodiment, the "M" cross-sectioned salient portions are machined into the top surface of the backing plate. As can be seen in FIG. 10, the salient portions 8a are arranged in a plurality of concentrically arranged annular rows.

The assembly is first bonded around a band or zone adjacent the periphery of the target as designated by the number 25. This initial bonding along the peripheral border of the assembly may be achieved by conventional means such as by E-beam welding under vacuum conditions, TIG welding, and friction welding and the like. Preferably, the bonding of the peripheral boundaries of the target and backing plate is performed via E-beam welding under vacuum conditions.

The result of the peripheral bonding is that a strong target/backing plate bond is provided in this preipheral area 25 that surrounds the salient portions 8a of the assembly. After the peripheral bonding, the assembly is consolidated, via pressure application thereto, at pressures of about 50 tons–5,000 tons; preferably less than about 1,000 tons, under low temperature conditions.

The projections 8a from the harder metal penetrate into the softer metal and disrupt the oxide film that may exist along the interface thereby promoting a metal to metal cold diffusion type bond.

After the low temperature pressure consolidation, the assembly may be subjected to a low temperature annealing step conducted at temperatures of about room to 200° C. to 482° C. for a period of 0.5 to 4 hours. This will help ensure adequate adhesion of the pressure consolidated surfaces.

The phrase "low temperature pressure consolidation" refers to pressure consolidation that may occur at a temperature of less than 50% of the melting point of the target, preferably at temperature of less than about 200 degrees C., preferably at room temperature up to about 38 degrees C.

Figure 7:
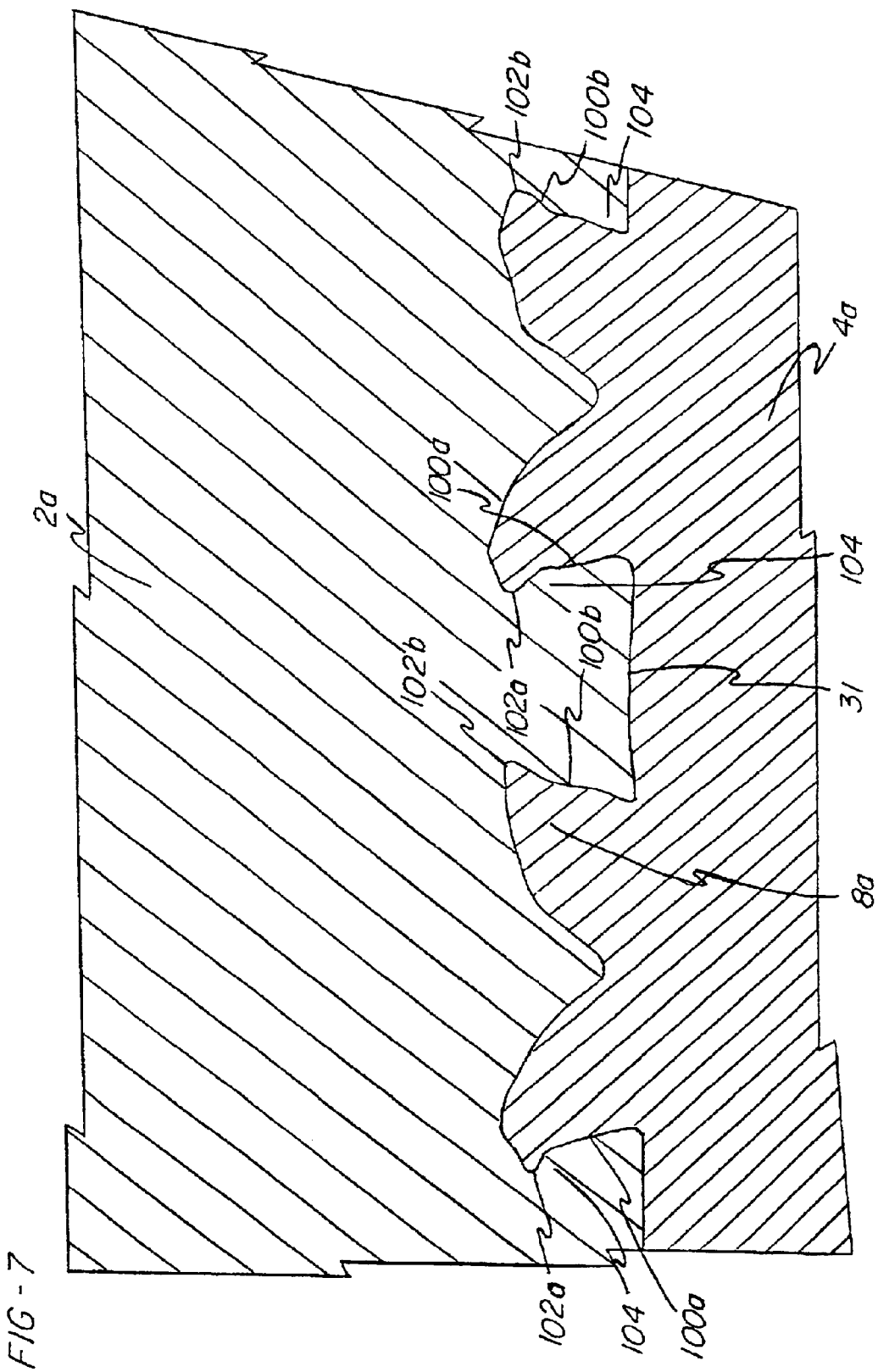
FIG. 7 is a schematic drawing of a photomicrograph taken showing a magnified view of a portion of the target/backing plate interface of the FIG. 4 embodiment.

Turning now to FIG. 7, there is shown a magnified view of the target/backing plate interface at the area having salient portions or projections 8a after the target/backing plate assembly has been consolidated by the above low temperature/pressure step. As a result of the low temperature pressure consolidation step, the points or projections 8a deform and fold back toward the interfacial plane 31, providing a physical locking mechanism between the surfaces.

As shown in FIG. 7, the deformed edge 100a of the "M" shaped projections, is bent toward the backing plate 4a as a result of the low temperature pressure consolidation. This edge 100a forms a re-entrant angle, as shown of about 55–60°, relative to the horizontal plane made along interfacial surfaces of the target and backing plate. The plane is shown generally in this figure as 31. The projections each contain a second bent edge 100b also forming a re-entrant angle relative to the horizontal plane. Due to bending of the edges 100a, 100b, the tips 102a, 102b of the projection adjacent edges 100a, 100b form a locking type joint, overlaying target material 104 and trapping target material 104 against separation forces or vectors that would act in shear or in a perpendicular direction relative to the plane 31. This forms a tenacious joint of backing plate and target.

The method and assembly have shown promise in bonding high-purity targets such as Al, Al—Cu, or Al—Cu—Si targets, to lower-purity backing members, such as Al 6061. Additionally, the method may also be employed to bond Cu targets and Cu containing alloy targets over 6061 Al or Cu metallurgies (Cu Alloys).

Figure 2:
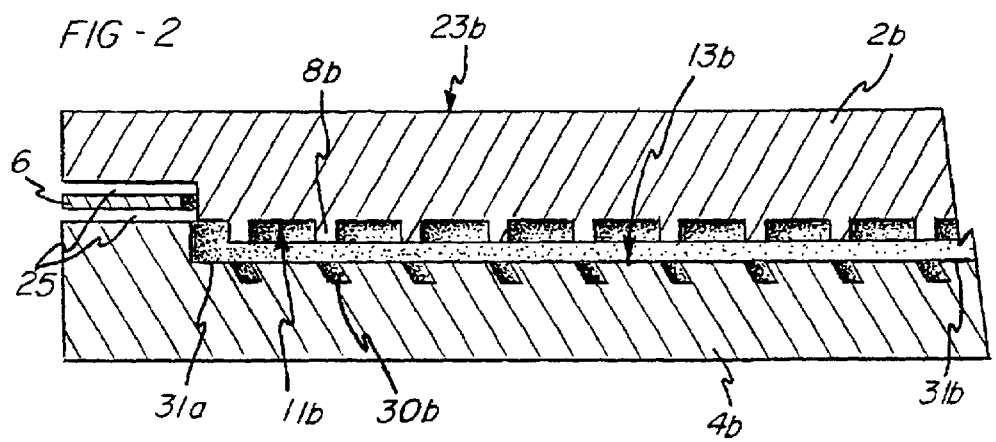
FIG. 2 is a cross-sectional view, similar to FIG. 1, of another embodiment of the invention.
Figure 5:
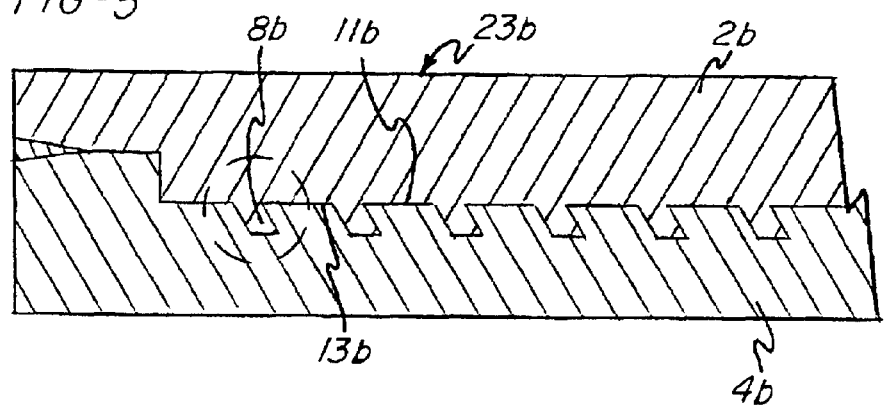
FIG. 5 is a cross-sectional view similar to FIG. 4 but showing the embodiment of FIG. 2 in its bonded position.

Turning now to FIGS. 2 and 5, there is shown a second embodiment of a target/backing plate assembly in accordance with the invention. The second embodiment comprises a target 2b having a top side 23b and a bottom side 11b, and a backing plate 4b having a top side 13b adapted to mate with the bottom side 11b. The filler material 6 may optionally be provided adjacent the peripheral border 25 of the second embodiment between the target 2b and backing plate 4b.

A plurality of salient portions of projections 8b are formed on the harder of either one of the surfaces 11b or 13b. In this embodiment, the projections are formed on the underside of the target. Corresponding grooves 30b, adapted to receive the projections 8b, are formed in the other of the surfaces 11b or 13b; here, on the top side of the backing plate. The grooves 30b are formed by machining concentric circular grooves that angle radially inward toward the center of the target/backing plate assembly. Alternatively, the grooves 30b may angle radially outward.

The target 2b and backing plate 4b are joined together in the same manner as detailed above for the first embodiment.

As can be seen in FIG. 5, as a result of the low temperature pressure consolidation step, the projection 8b are deformed radially inward and fold back toward the surface 13b, thereby providing a physical locking mechanism between the surfaces 11b, 13b.

Figure 3:
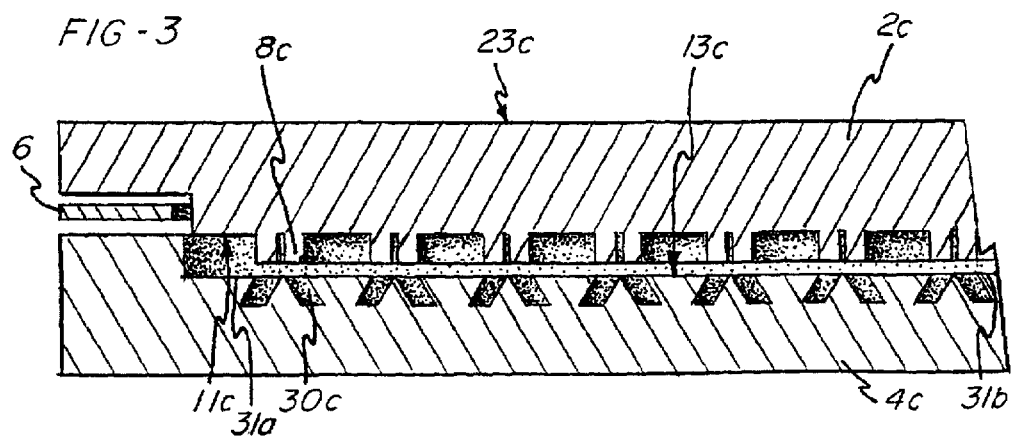
FIG. 3 is a cross-sectional view, similar to FIG. 1, of another embodiment of the invention.
Figure 6:
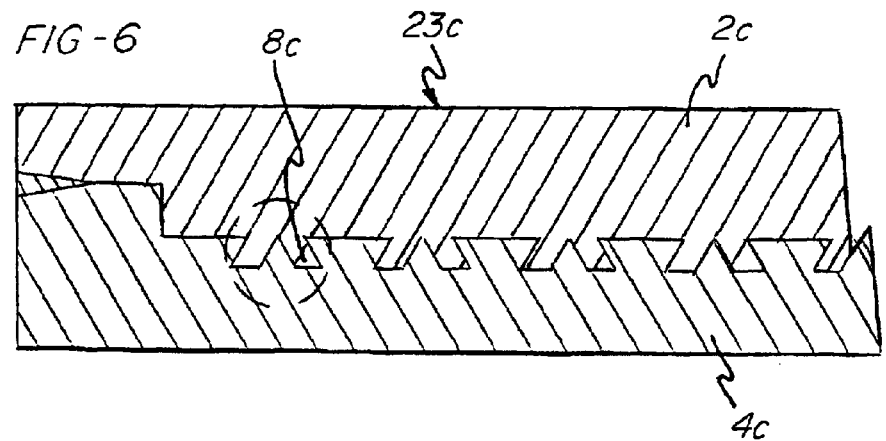
FIG. 6 is a cross-sectional view similar to FIG. 4 but showing the embodiment of FIG. 3 in its bonded position.

A third embodiment of the target/backing plate assembly of the invention is shown in FIGS. 3 and 6, wherein features corresponding to those of the first and second embodiments disclosed above are denoted by the same reference numerals having the suffix "c". As shown, alternate grooves 30c are formed so as to angle radially opposite each other so that, after the low temperature pressure consolidation step, the projections 8c are deformed or "splay" in opposite directions.

Figure 8:
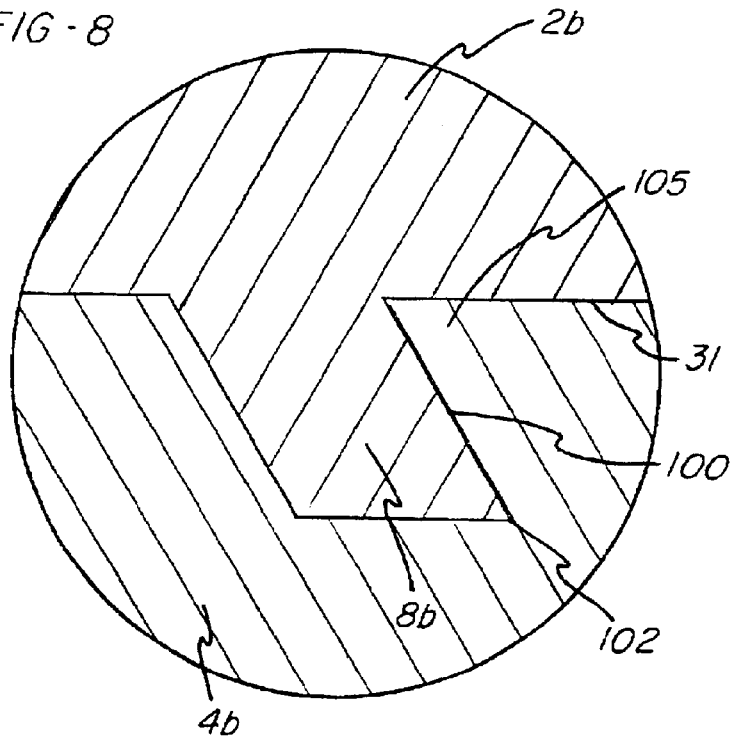
FIG. 8 is a magnified view of a portion of the target/backing plate interface encircled in FIG. 5.

Turning now to FIG. 8, the target/backing plate interface is shown for the FIG. 2 target/backing plate joint structure. Here, the edge 100 of projection 8b forms a re-entrant angle ∝ relative to the plane of the surfaces of target 2b and backing plate 4b (i.e. plane 31) of about 60°. The tip 102 of the projection connected to edge 100 thereby locks or grips the backing plate material 105 to withstand mechanical and thermal forces that may otherwise act during sputtering to separate the assembly.

Figure 9:
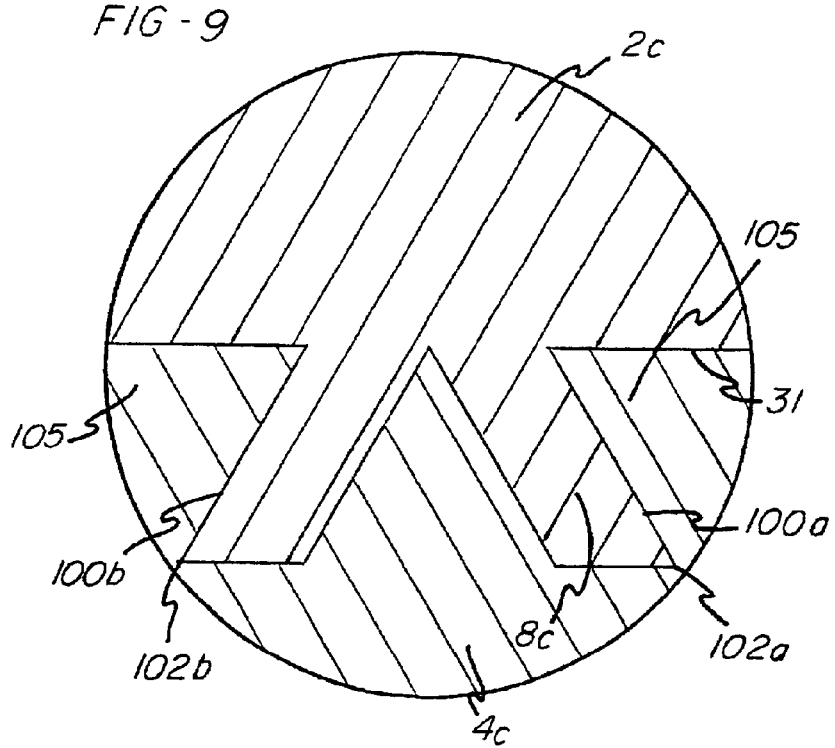
FIG. 9 is a magnified view of a portion of the target/backing plate interface encircled in FIG. 6.

FIG. 9 magnifies the target/backing plate joint or interface of FIG. 6, 2 having substantially "V" shaped projections 8c with deformed edges 100a, 100b each defining a re-entrant angle ∝ of about 60° relative to the horizontal mating plane of the target and backing plate. Tips 102a, 102b respectively of the projection form a locking joint trapping backing plate material 105 in a snug, interlocking joint structure.

The locking joint of the invention can thereby be described as a joint formed between mating interfacial surfaces of the target and backing plate wherein the harder metal or alloy of either the target or backing plate member is provided with a projection. An edge of the projection is bent or deformed during the lower temperature/pressure consolidation so that it forms a re-entrant angle of less than 90° as measured from the mating plane formed between the target and backing plate. Preferably, this angle is on the order of about 35–80°.

The leading tip of the projection connected to this re-entrant edge thereby forms an angled lock or grip over the other metal to thereby resist shear and tensile forces that may otherwise tend to de-bond the assembly.

The invention will he further described in conjunction with the ensuing examples which are not to be construed as limitations to the inventions but instead are illustrative of specific embodiments of the invention.

EXAMPLE 1

An assembly of the type shown in FIG. 1 was bonded in accordance with the invention. Target 2a was composed of high purity Al with the backing plate 4a composed of Al 6061. The projections 8a were provided in the backing plate 4a with each projection 8a having a height of about 0.05". A filler material 6 comprising Al-4% Si was positioned around the inside of the peripheral boundary of the assembly. The peripheral zone was E-beam welded under vacuum. Then, the assembly was pressure consolidated at room temperature such that the overall thickness of the assembly decreased by about 0.1".

EXAMPLE 2

An assembly of the general type shown in FIG. 2 was bonded in accordance with the invention. Target 2b was composed of high purity Cu with the backing plate 4b composed of Cu-1% Cr. The projections were provided in the backing plate with each projection having a height of about 0.1". No filler material was used. The peripheral zone was E-beam welded under vacuum. Then, the assembly was pressure consolidated at room temperature such that the overall thickness of the assembly decreased by about 0.1".

While the methods described herein, and the target/backing plate assemblies produced in accordance with the methods, have been described with regard to certain specific forms and certain modifications thereof, it will be appreciated that a wide variety of other modifications can be made without departing from the scope and spirit of this invention as defined in the appended claims. It is also to be kept in mind that reference to a metal or metal component herein also includes reference to alloyed forms of the stated metal.

What is claimed is:

1. In a method of preparing a bonded sputter target/backing plate assembly comprising a target composed of a metal or alloy to be sputtered and an underlying metallic backing plate member, an improved method for joining said target and backing plate along mating surfaces thereof, comprising:

a) forming a plurality of projections in at least one of said mating surfaces;

b) positioning said target and backing plate adjacent each other to form an assembly having an interface defined by said mating surfaces;

c) pressure consolidating said assembly under low temperature conditions less than 38° C. to bondingly join said target and backing plate together with said projections penetrating into and mechanically locking over the other of said mating surfaces.

2. Method as recited in claim 1 wherein said assembly comprises a peripheral boundary surrounding said projections and wherein said method comprises the additional step (d) of bonding said assembly proximate said peripheral boundary.

3. Method as recited in claim 2 wherein said step (d) is performed after said step (b) and before said step (c).

4. Method as recited in claim 3 wherein said step (d) comprises e-beam welding of said peripheral boundary.

5. Method as recited in claim 4 wherein said step (d) further comprises interposing a weldable filler material between said target and said backing plate proximate said peripheral boundary.

6. Method as recited in claim 2 wherein said step (d) comprises friction welding.

7. Method as recited in claim 2 wherein said step (d) comprises TIG welding.

8. Method as recited in claim 1 wherein said target comprises Al, Cu, Ti, Co or their alloys.

9. Method as recited in claim 6 wherein said backing plate comprises Al, stainless steel, Cu, Ti or their alloys.

10. Method as recited in claim 6 wherein said target comprises Cu.

11. Method as recited in claim 2 wherein said step (d) comprises e-beam welding said target along an annular zone located adjacent said peripheral boundary.

12. Method as recited in claim 1 wherein said step (c) comprises pressure consolidating said assembly at about room temperature.

13. Method as recited in claim 2 further comprising (e) low temperature annealing said pressure consolidated assembly.

14. Method as recited in claim 1 wherein said low temperature is about room temperature.

15. Method of bonding a sputter target to a backing plate member along a plane defined by mating interfacial surfaces of said target and backing plate, said method comprising:
  a) forming a plurality of salient portions in one of said interfacial surfaces, wherein said salient portions have at least one edge and a projection tip connected to said edge;
  b) positioning said target and backing plate in a position ready for bonding with said interfacial surfaces adjacent each other; and consolidating said target and backing plate at a temperature of less than 38° C. and at a pressure sufficient to deform said at least one edge so that said at least one edge forms a re-entrant angle relative to said plane of less than 90° and said projection tip penetrates into the other of said interfacial surfaces and forms an angled mechanical locking grip over the other of said interfacial surfaces to bondingly join said target and backing plate together,
  c) consolidating said target and backing plate at a temperature of less than about 38° C. and at a pressure sufficient to deform said at least one edge so that said at least one edge forms a re-entrant angle relative to said plane of less than 90° and said projection tip penetrates into the other of said interfacial surfaces and forms an angled mechanical locking grip over the other of said interfacial surfaces to bondingly join said target and backing plate together.

16. Method as recited in claim 15 wherein said step (c) is conducted at about room temperature.

17. Method as recited in claim 15 wherein said target is Al or Al alloy.

18. Method as recited in claim 15 wherein said target is Cu or Cu alloy.

19. Method as recited in claim 15 wherein said target and backing plate have a peripheral boundary portion circumscribing said salient portions, said method further comprising, prior to said step (c), a step (d) of bonding said target and backing plate member around a peripheral boundary portion of said mating interfacial surfaces.

20. Method as recited in claim 19 wherein said step (d) comprises interposing a weldable filler material between said target and said backing plate along said peripheral boundary portion.

21. Method as recited in claim 19 wherein step (d) comprises e-beam welding.

22. Target/Backing plate assembly made by the method of claim 1.

23. Combination comprising a sputter target and backing plate, said target and backing plate mating along a plane defined by mating interfacial surfaces of each, a plurality of salient portions formed in one of said interfacial surfaces and having at least one edge and a projecting tip connected to said edge, said edge being bent at a first re-entrant angle of less than about 90° relative to said plane and said projecting tip forming a second re-entrant angled locking grip extending into the other of said interfacial surfaces.

24. Combination as recited in claim 23 further comprising a peripheral zone surrounding said salient portions, and a bondable filler material positioned in said peripheral zone.

25. Combination as recited in claim 23 wherein said backing plate comprises Al alloy and said target comprises Al, said salient portions comprising substantially "M" cross sectioned ridges formed in said backing plate with said ridges provided along said interfacial surface of said backing plate in a plurality of concentrically arranged rows.

26. Combination as recited in claim 23 wherein said target comprises Cu.

27. Combination as recited in claim 23 wherein said salient portions include substantially "M" shaped cross-sectioned ridges and wherein said at least one edge is bent at an angle of about 35–80°.

28. Combination as recited in claim 23 wherein said salient portions include substantially "V" shaped cross-sectional ridges, each said "V" shaped ridge having a pair of edges bent at re-entrant angles.

29. In a method of preparing a bonded sputter target/backing plate assembly comprising a target composed of a metal or alloy to be sputtered and an underlying metallic backing plate member, an improved method for joining said target and backing plate along mating surfaces thereof, comprising:
  a) forming a plurality of salient portions in at least one of said mating surfaces,
  b) positioning said target and backing plate adjacent each other to form an assembly having an interface defined by said mating surfaces;
  c) pressure consolidating said assembly under low temperature conditions less than 38° C. to bondingly join said target and backing plate together with said salient portions penetrating into the other of said mating surfaces and extending back toward said other mating surfaces at a re-entrant angle of less than 90° relative to a plane between said mating surfaces.

30. In a method of preparing a bonded sputter target/backing plate assembly comprising a target composed of a metal or alloy to be sputtered and an underlying metallic backing plate member, an improved method for joining said target and backing plate along mating surfaces thereof, comprising:
  a) forming a plurality of projections in at least one of said mating surfaces with a peripheral boundary surrounding said projections;
  b) positioning said target and backing plate adjacent each other to form an assembly having an interface defined by said mating surfaces;
  c) pressure consolidating said assembly under low temperature conditions of less than 38° C. and at a pressure sufficient to bondingly join said target and backing plate together with said projections penetrating into and mechanically locking over the other of said mating surfaces; and d) e-beam welding said assembly proximate said peripheral boundary, said step d) being performed after said step b) and before said step c).

31. Method as recited in claim 30 wherein said step d) further comprises interposing a weldable filler material between said target and said backing plate proximate said peripheral boundary.

32. In a method of preparing a bonded sputter target/backing plate assembly comprising a target composed of a metal or alloy to be sputtered and an underlying metallic backing plate member, an improved method for joining said target and backing plate along mating surfaces thereof, comprising:
   a) forming a plurality of projections in at least one of said mating surfaces with a peripheral boundary surrounding said projections;
   b) positioning said target and said backing plate adjacent each other to form an assembly having an interface defined by said mating surfaces;
   c) pressure consolidating said assembly under low temperature conditions; and
   d) friction welding said assembly proximate said peripheral boundary, said target comprising copper.

33. In a method of preparing a bonded sputter target/backing plate assembly comprising a target composed of a metal or alloy to be sputtered and an underlying metallic backing plate member, an improved method for joining said target and backing plate mating surfaces thereof, comprising:
   a) forming a plurality of projections in at least one of said mating surfaces with a peripheral boundary surrounding said projections;
   b) positioning said target and backing plate adjacent each other to form an assembly having an interface defined by said mating surfaces;
   c) pressure consolidating said assembly under low temperature conditions of less than 38° C. and at a pressure sufficient to bondingly join said target and backing plate together with said projections penetrating into and mechanically locking over the other of said mating surfaces; and
   d) e-beam welding said assembly proximate said peripheral boundary.

34. In a method of preparing a bonded sputter target/backing plate assembly comprising a target composed of a metal or alloy to be sputtered and an underlying metallic backing plate, an improved method for joining said target and backing plate along mating surfaces thereof, comprising:
   a) forming a plurality of projections in at least one of said mating surfaces with a peripheral boundary surrounding said projections;
   b) positioning said target and backing plate adjacent each other to form an assembly having an interface defined by said mating surfaces;
   c) pressure consolidating said assembly under low temperature conditions;
   d) bonding said assembly proximate said peripheral boundary; and
   e) annealing said pressure consolidated assembly at low temperature.

35. Method of bonding a sputter target to a backing plate member along a plane defined by mating interfacial surfaces of said target and backing plate, said method comprising:
   a) forming a plurality of salient portions in one of said interfacial surfaces, wherein said salient portions have at least one edge and a projection tip connected to said edge, said target and said backing plate having a peripheral boundary circumscribing said salient portions,
   b) positioning said target and backing plate in a position ready for bonding with said interfacial surfaces adjacent each other,
   c) consolidating said target and backing plate at a temperature of less than about 50% of the melting point of the lower melting member of said target and said backing plate and at a pressure sufficient to deform said at least one edge to form a re-entrant angle relative to said plane of less than 90° and said projection tip forming an angled, locking grip over the other of said interfacial surfaces; and
   d) e-beam welding said target and said backing plate member around said peripheral boundary, said step d) occurring prior to said step c).

36. Method of bonding a sputter target to a backing plate member along a plane defined by mating interfacial surfaces of said target and backing plate, said method comprising:
   a) forming a plurality of salient portions in one of said interfacial surfaces, wherein said salient portions have at least one edge and a projection tip connected to said edge,
   b) positioning said target and backing plate in a position ready for bonding with said interfacial surfaces adjacent each other,
   c) consolidating said target and backing plate at a temperature of less than about 50% of the melting point of the lower melting member of said target and said backing plate and at a pressure sufficient to deform said at least one edge so that at least one edge forms a re-entrant angle relative to said plane of less than 90° and said projection tip forms an angled mechanical locking grip over the other of said interfacial surfaces, said target and said backing plate having a peripheral boundary portion circumscribing said salient portions; said method further comprising
   d) e-beam welding said target and backing plate member around a peripheral boundary portion of said mating interfacial surfaces, said step d) being performed prior to said step c).

37. In a method of preparing a bonded sputter target/backing plate assembly comprising a target composed of a metal or alloy to be sputtered and an underlying metallic backing plate member, an improved method for joining said target and backing plate along mating surfaces thereof, comprising:
   a) forming a plurality of projections in at least one of said mating surfaces to extend into and mechanically lock over the other of said mating surfaces;
   b) positioning said target and backing plate adjacent each other to form an assembly having an interface defined by said mating surfaces;
   c) pressure consolidating said assembly under low temperature conditions less than 38°; wherein said assembly comprises a peripheral boundary surrounding said projections, and
   d) bonding said assembly proximate said peripheral boundary.

38. Method as recited in claim 37 wherein said step (d) is performed after said step (b) and before said step (c).

39. Method as recited in claim 38 wherein said step (d) comprises e-beam welding of said peripheral boundary.

40. Method as recited in claim 39 wherein said step (d) further comprises interposing a weldable filler material between said target and said backing plate proximate said peripheral boundary.

41. Method as recited in claim 37 wherein said step (d) comprises friction welding.

42. Method as recited in claim 37 wherein said step (d) comprises TIG welding.

43. Method as recited in claim 37 wherein said target comprises Cu.

44. Method as recited in claim 37 wherein said step (d) comprises e-beam welding said target along an annular zone located adjacent said peripheral boundary.

45. Method as recited in claim 37 further comprising (e) low pressure consolidated assembly.

\* \* \* \* \*